United States Patent [19]
Chen et al.

[11] Patent Number: 5,363,066
[45] Date of Patent: Nov. 8, 1994

[54] FAST CMOS CHARGE PUMP CIRCUIT

[75] Inventors: Dao-Long Chen; Robert D. Waldron, both of Fort Collins, Colo.

[73] Assignee: AT&T Global Information Solutions Company (FKA NCR Corporation), Dayton, Ohio

[21] Appl. No.: 78,880

[22] Filed: Jun. 16, 1993

[51] Int. Cl.$^5$ ............... H03L 7/089; H03L 7/093
[52] U.S. Cl. ............................... 331/17; 331/8; 331/25; 327/108; 327/157
[58] Field of Search ............... 331/8, 17, 25; 323/315; 307/584, 270

[56] References Cited
U.S. PATENT DOCUMENTS 5,142,696  8/1992  Kosiec et al. ................. 455/260

Primary Examiner—Siegfried H. Grimm
Attorney, Agent, or Firm—Paul W. Martin

[57] ABSTRACT

A charge pump circuit for a phase-locked loop circuit which provides substantially constant charge and discharge currents characterized by minimal overshoots and undershoots. The charge pump circuit includes a level shifter circuit which attenuates voltage swings in Up and Down signals from the phase detector and provides control signals. The charge pump circuit also includes a feedback circuit coupled to the level shifter which compares the output voltage of the charge pump to predetermined first and second reference voltages and increases and decreases the charge and discharge currents to minimize overshoot and undershoot noise as determined by the control signals.

10 Claims, 8 Drawing Sheets

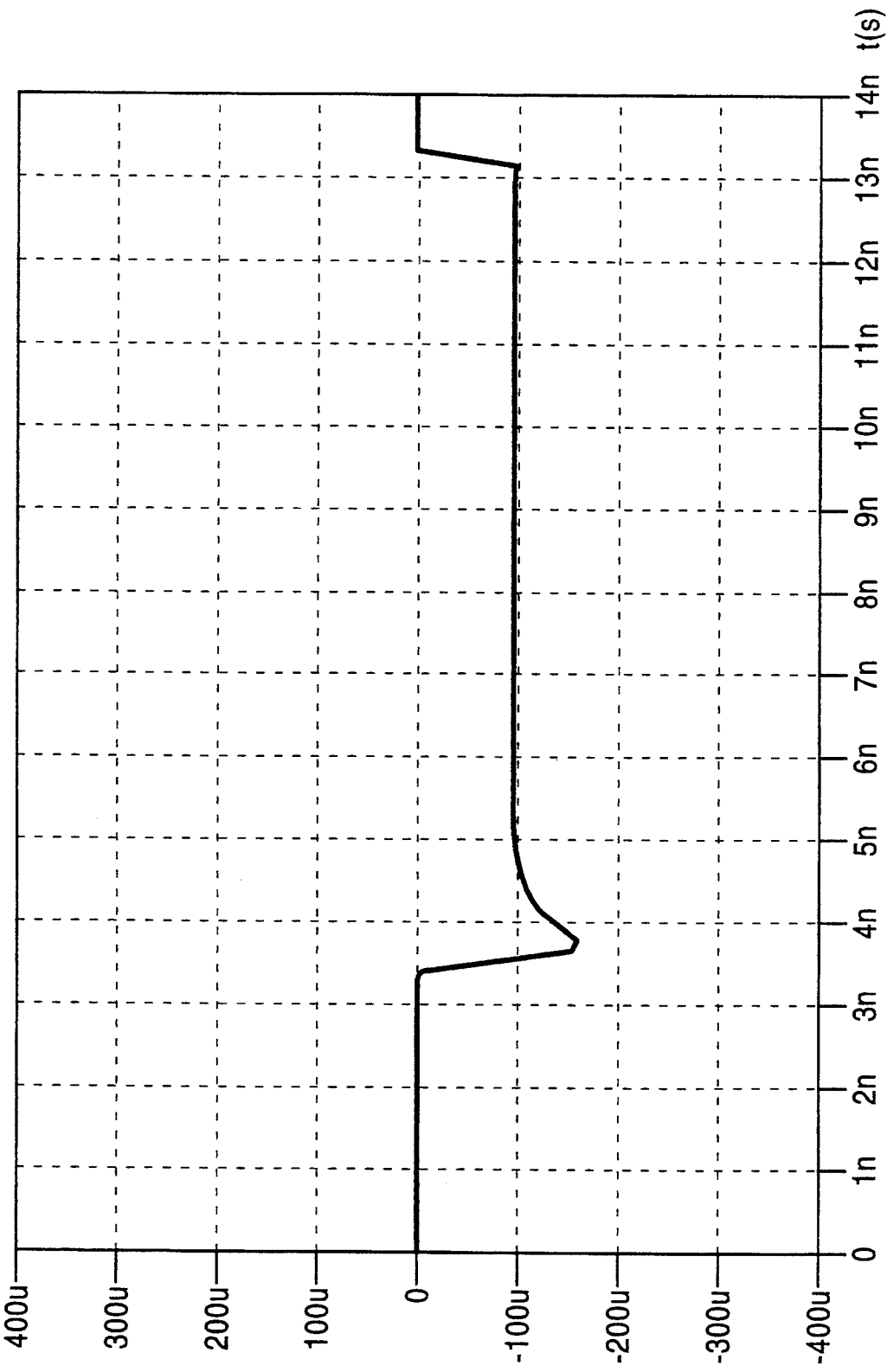

FAST CMOS CHARGE PUMP CIRCUIT

BACKGROUND OF THE INVENTION

The present invention relates to phase-locked loop circuitry, and more specifically to a fast CMOS charge pump circuit.

Phase-locked loop (PLL) circuits are widely used in electronic systems for clock recovery, frequency synthesis, and many other applications. PLL circuits are discussed in the following references:

1. "Phaselock Techniques", by Floyd M. Gardner, John Wiley & Sons, 1979.
2. "Phase-locked Loops — Theory, Design, and Applications", by Dr. Roland E. Best, McGraw-Hill, 1984.

These references are hereby incorporated by reference.

There are many applications for PLL circuits in high-performance computer systems. For example, a phase-locked loop may be used as a frequency multiplier to double the on-chip clock frequency. A phase detector detects any phase difference between an input signal and the output signal of a voltage-controlled oscillator (VCO) and generates control signals to minimize the phase difference.

A PLL circuit may also employ a charge pump circuit which responds to control signals from the phase detector to modulate the amount of charge stored in a loop filter between the charge pump circuit and the VCO. The output voltage of the loop filter controls the VCO frequency.

It is important to match the charge and discharge currents in the charge pump circuit. A mismatch in the two currents results in static phase error between the input signal and the output signal of the VCO. This static phase error can be a serious problem in many systems. For example, the bit error rate in the read channel of a disk sub-system may be strongly affected by the static phase error. This mismatch can only be minimized by minimizing the mismatch between the charge and discharge currents from the charge pump circuit.

Unfortunately, conventional charge pump circuits suffer from large overshoots in current at the beginning of the charge and discharge cycles and a large undershoot in current at the end of the charge and discharge cycles. For lower-frequency systems, the overshoots and undershoots are not a significant problem because they represent a small part of the total charge and discharge cycles.

However, in higher-frequency high-performance systems having very short charge and discharge cycles, the undershoots and overshoots represent a significant part of the charge and discharge cycles. The overshoots and undershoots cause difficulty in matching the charge and discharge currents and cause high-frequency noise in the output of the charge pump circuit. This high-frequency noise is difficult to filter by the loop filter. Consequently, noise is injected into the VCO, resulting in phase jitter at the output of the VCO.

Therefore, it would be desirable to produce a charge pump circuit which does not produce the overshoots and undershoots of traditional charge pump circuits.

SUMMARY OF THE INVENTION

In accordance with the teachings of the present invention, a fast CMOS charge pump circuit is provided. The charge pump circuit provides substantially constant charge and discharge currents characterized by minimal overshoots and undershoots and includes a level shifter circuit which attenuates voltage swings in Up and Down signals from the phase detector and provides control signals. The charge pump circuit also includes a feedback circuit coupled to the level shifter which compares the output voltage of the charge pump to predetermined first and second reference voltages and increases and decreases the charge and discharge currents to minimize overshoot and undershoot noise as determined by the control signals.

It is a feature of the present invention that the charge pump circuit provides substantially constant charge and discharge currents at the operating frequencies of CMOS devices.

It is accordingly an object of the present invention to provide a fast CMOS charge pump circuit.

It is another object of the present invention to provide a fast CMOS charge pump circuit which provides substantially constant charge and discharge currents.

BRIEF DESCRIPTION OF THE DRAWINGS

Additional benefits and advantages of the present invention will become apparent to those skilled in the art to which this invention relates from the subsequent description of the preferred embodiments and the appended claims, taken in conjunction with the accompanying drawings, in which:

FIGS. 3A–3B are waveforms illustrating the operating differences between conventional charge pump circuits and the charge pump circuit of the present invention.

DETAILED DESCRIPTION OF THE PREFERRED EMBODIMENTS

Figure 1A:
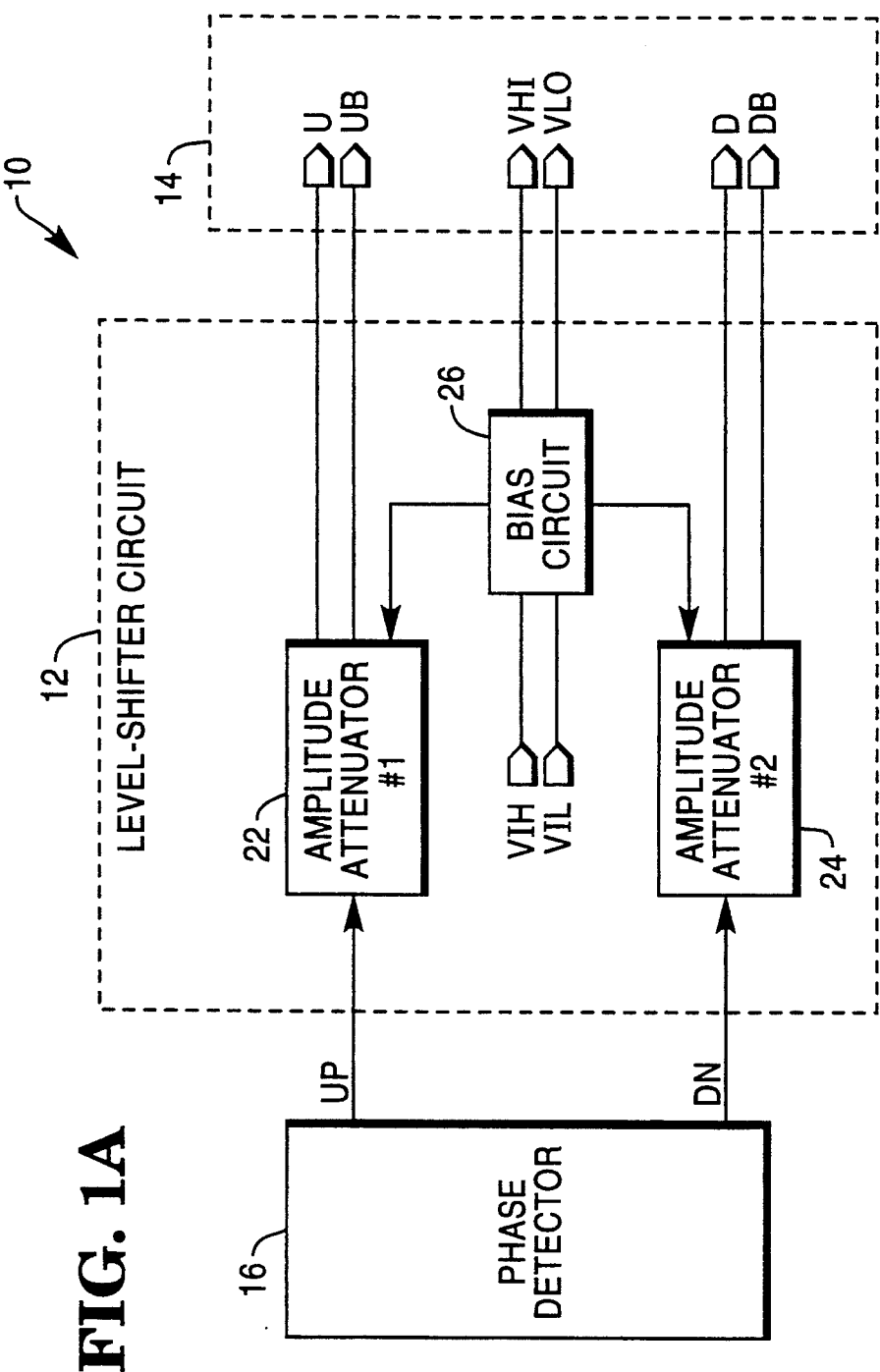
FIGS. 1A and 1B form a block diagram of the charge pump circuit of the present invention.
Figure 1B:
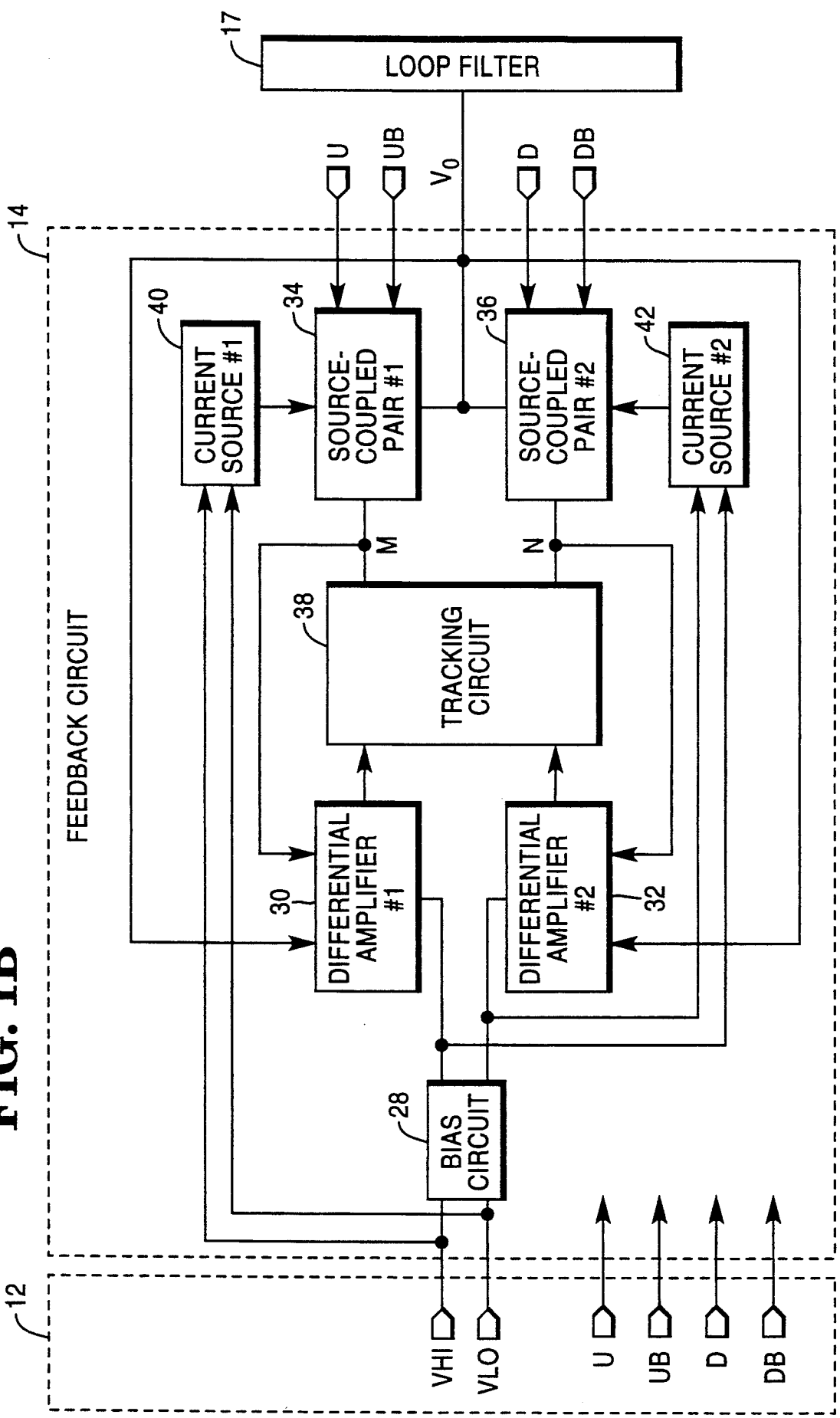

Referring now to FIGS. 1A and 1B, charge pump circuit 10 of the present invention includes level shifter 12 (FIG. 1A) and feedback circuit 14 (FIG. 1B).

Level shifter 12 receives and attenuates up and down control signals (UP) and (DN) from phase detector 16. Level shifter 12 includes first and second amplitude attenuation circuits 22 and 24, and bias circuit 26.

First and second attenuation circuits 22 and 24 reduce the voltage swings at the up and down inputs UP and DN so that the switching noise coupled into feedback circuit 14 is minimized. First and second attenuation circuits 22 and 24 also generate differential up and down output signals U, UB, and D, DB for feedback circuit 14.

Bias circuit 26 provides a bias voltage to first and second attenuation circuits 22 and 24. It also generates the bias voltages VHI and VLO for use by feedback circuit 14.

Feedback circuit 14 minimizes the switching noise at the output of charge pump 10. Charge pump output voltage Vo is coupled to loop filter 17. Feedback circuit 14 includes bias circuit 28, differential amplifiers 30–32, source-coupled pairs 34–36, tracking circuit 38, and first and second current sources 40 and 42.

Bias circuit 28 provides bias voltages to differential amplifiers 30–32 and current sources 40 and 42.

First differential amplifier 30 compares charge pump output Vo with the voltage at node M.

Second differential amplifier 32 compares charge pump output Vo with the voltage at node N.

First source-coupled pair 34 compares outputs U and UB from amplitude attenuator 22.

Second source-coupled pair 36 compares outputs D and DB from amplitude attenuator 24.

Tracking circuit 38 links first and second sourcecoupled pairs 34 and 36 to first and second differential amplifiers 30 and 32, respectively, so that the voltages at nodes N and M may track output voltage Vo.

First and second current sources 40 and 42 provide charge and discharge currents to loop filter 17 through source-coupled pairs 34 and 36.

Figure 2A:
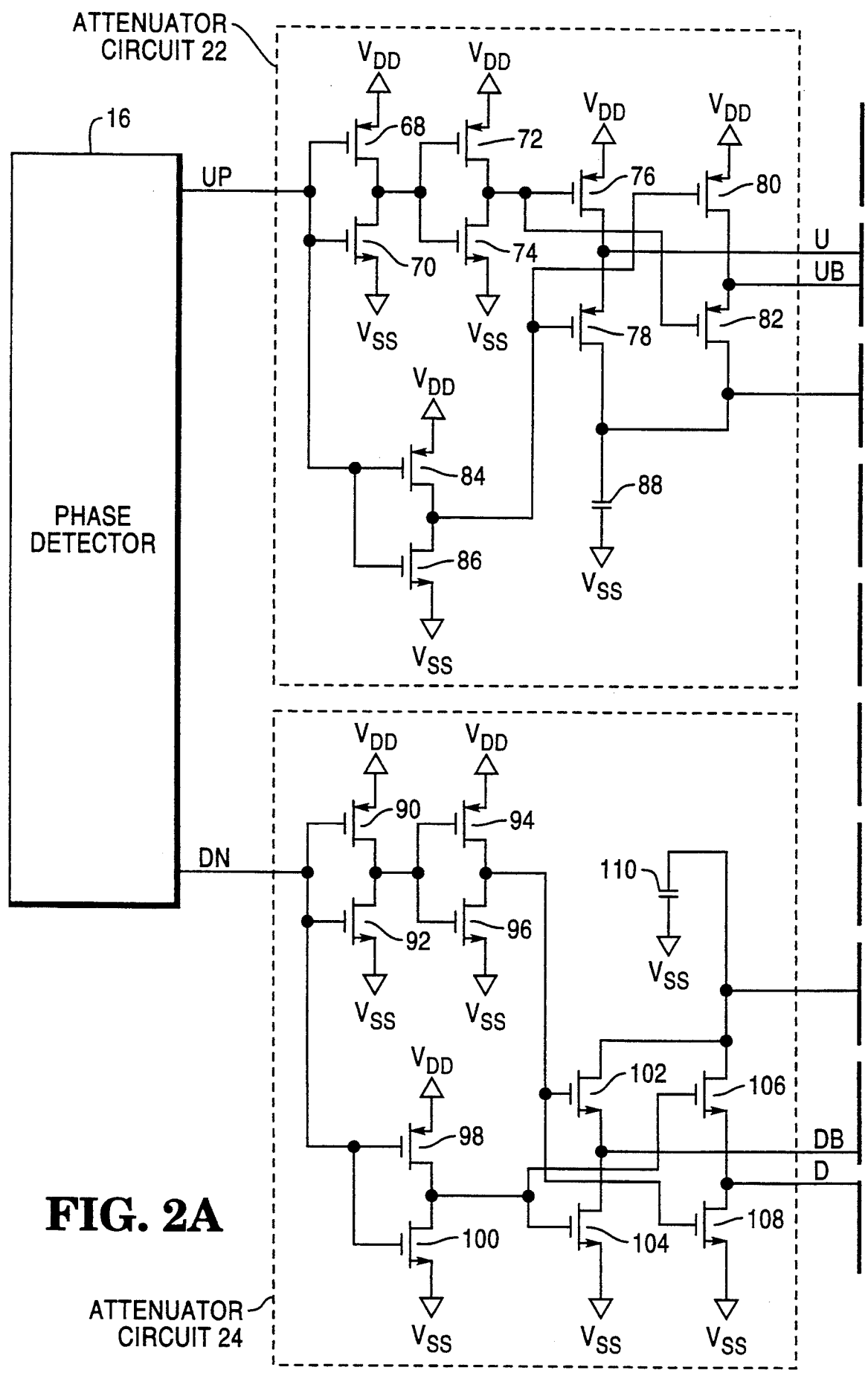
FIGS. 2A–2B form a schematic diagram of the level-shifter circuit of FIG. 1.
Figure 2B:
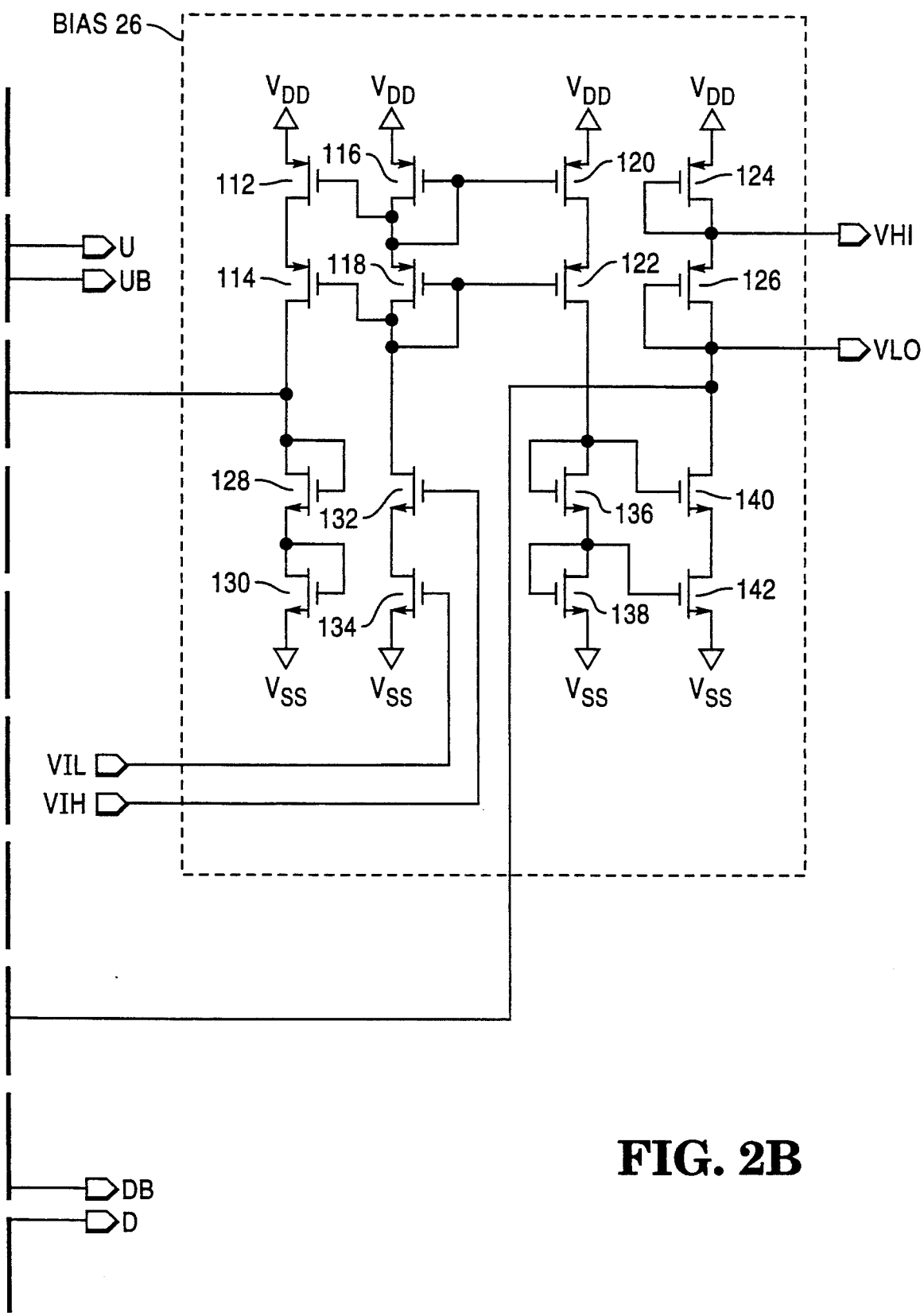

Referring now to FIGS. 2A–2B, level shifter 12 is shown in more detail.

First attenuator circuit 22 includes transistors 68–86 and capacitor 88. It attenuates input signal UP from a peak-to-peak voltage of five volts (0–5 v) to a peak-to-peak voltage of 3 volts (2–5 v) at outputs U and UB. Capacitor 88 acts as a high-pass filter to reduce switching noise at outputs U and UB. Up Signals U and UB are complementary signals required by source-coupled pair 34. Cross-coupled transistors 76–82 minimize the skew between signals U and UB.

Similar to first attenuation circuit 22, second attenuator circuit 24 includes transistors 90–108 and capacitor 110. Second attenuation circuit 24 attenuates input signal DN from a peak-to-peak voltage of five volts (0–5 v) to a peak-to-peak voltage of 3 volts (0–3 v) at outputs D and DB. Capacitor 110 acts as a high-pass filter to reduce switching noise at outputs D and DB.

First and second attenuation circuits 22 and 24 attenuate input signals by switching between voltages VDD (or VSS) and a fixed bias voltage provided by bias circuit 26.

Bias circuit 26 includes transistors 112–142. It provides a bias voltage of about two volts to outputs U and UB through transistors 78 and 82 of first attenuator circuit 22 and about three volts to outputs D and DB through transistors 106 and 102 of second attenuator circuit 24.

Figure 2C:
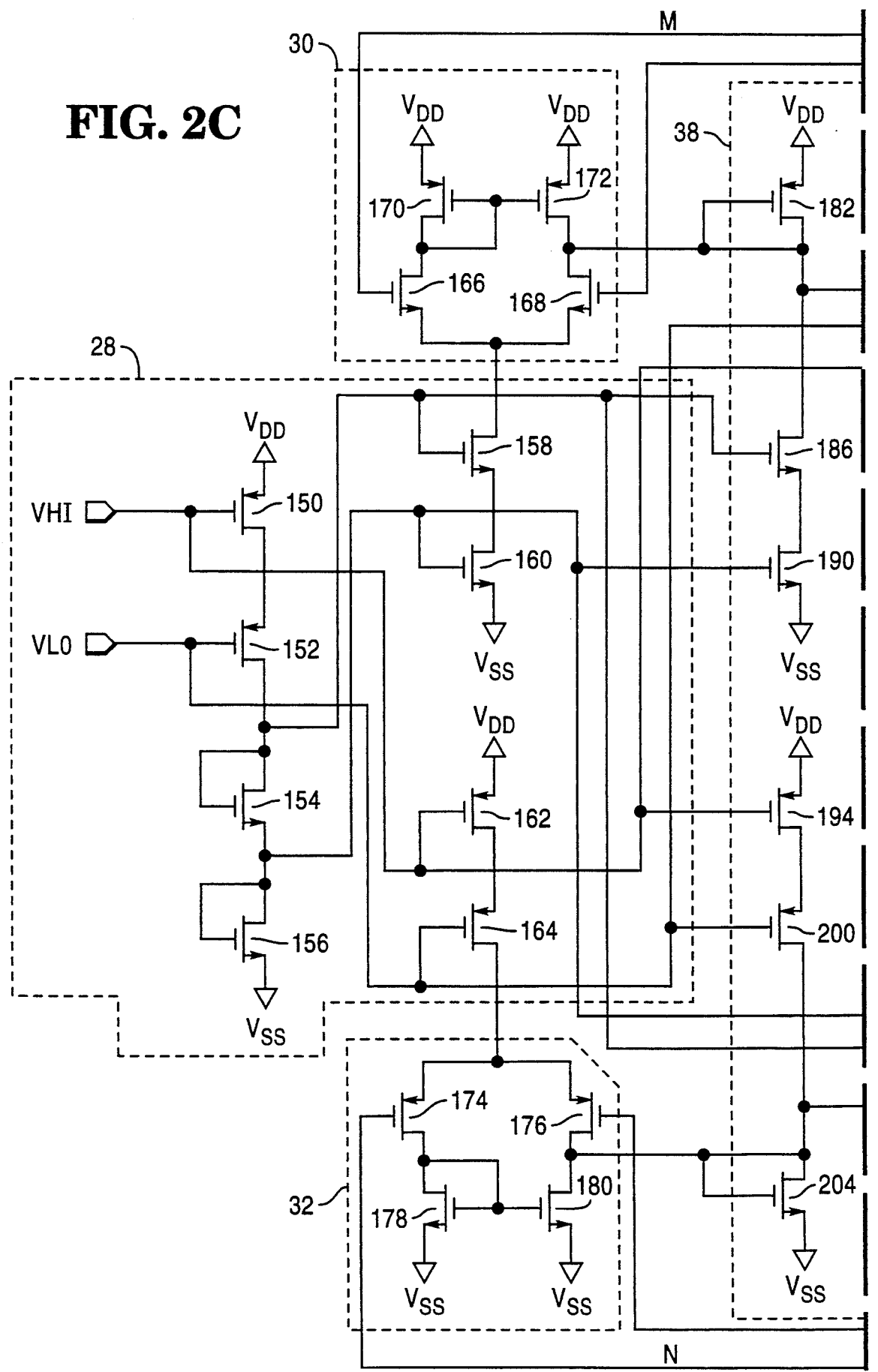
FIG. 2C–2D form a schematic diagram of the feedback circuit of FIG. 1.
Figure 2D:
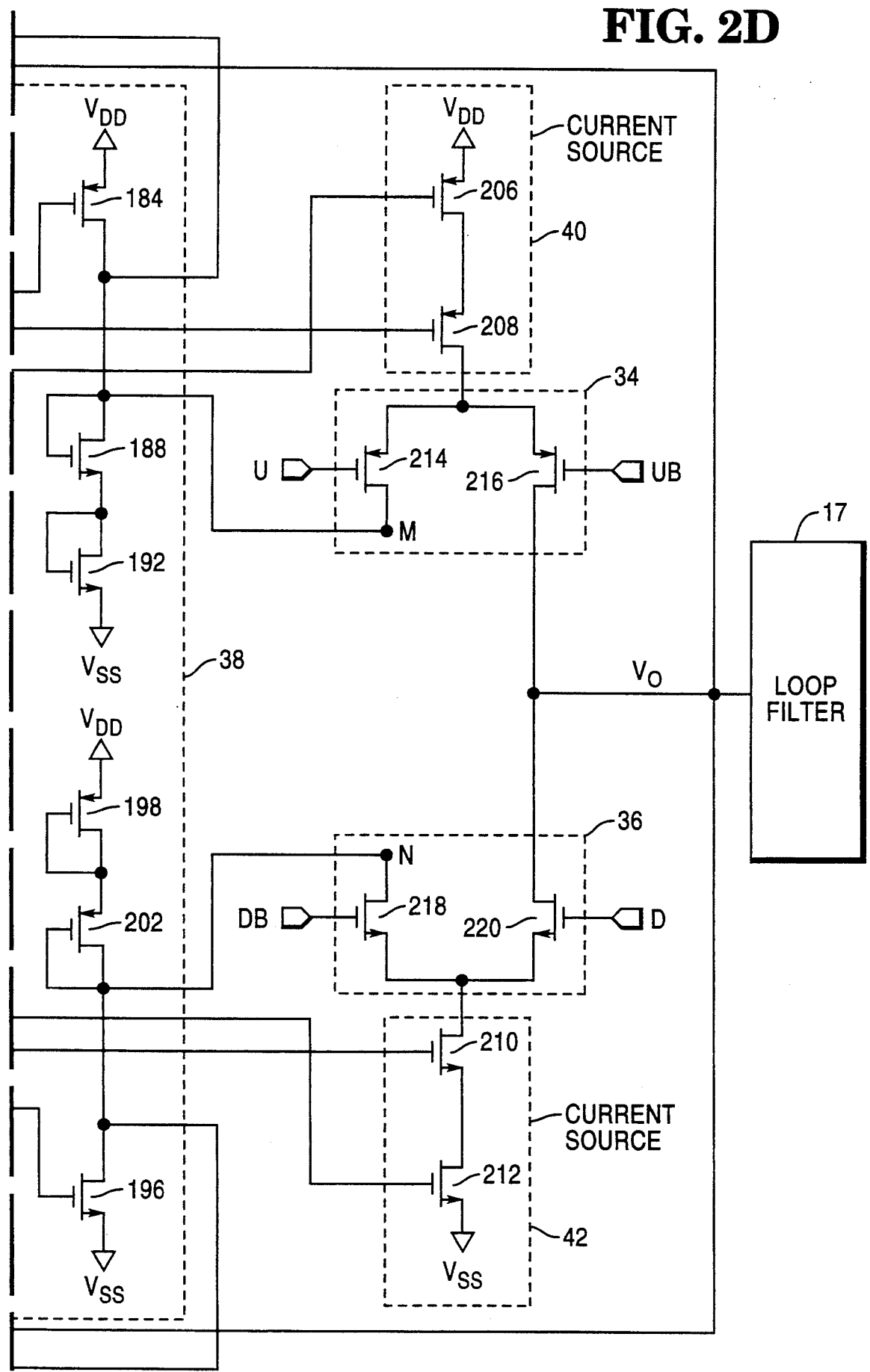

Turning now to FIGS. 2C–2D, feedback circuit 14 is shown in more detail. Bias circuit 28 includes transistors 150–164.

Differential amplifier 30 includes transistors 166–172. The gate of transistor 166 couples to node M. The gate of transistor 168 couples to output Vo of charge pump 10. The sources of transistors 166 and 168 are coupled together and to the drain of transistor 158 of bias circuit 28. The drain of transistor 172 couples to tracking circuit 38.

Differential amplifier 32 includes transistors 174–180. The gate of transistor 174 couples to node N. The gate of transistor 176 couples to output Vo of charge pump 10. The sources of transistors 174 and 176 are coupled together and to the drain of transistor 164 of bias circuit 28. The drain of transistor 180 couples to tracking circuit 38.

Tracking circuit 38 includes a first group of transistors 182–192, which respond to a difference between output voltage Vo and node voltage M, and a second group of transistors 194–204, which respond to a difference between output voltage Vo and node voltage N. If output voltage Vo is higher than node voltage M, differential amplifier 30 increases the current flow through transistor 184, thereby increasing node voltage M. Likewise, if output voltage Vo is higher than node voltage N, differential amplifier 32 reduces the current flow through transistor 196, thereby increasing node voltage N.

Current sources 40 and 42 include transistor pairs 206, 208 and 210, 212 and provide constant charge and discharge currents to source-coupled pairs 34 and 36, respectively.

Source-coupled pairs 34 and 36 include transistor pairs 214, 216 and 218, 220. Depending upon the logic states of signals U, UB, and D, DB, the charge and discharge currents are delivered either to output Vo or nodes M and N.

Figure 3A:
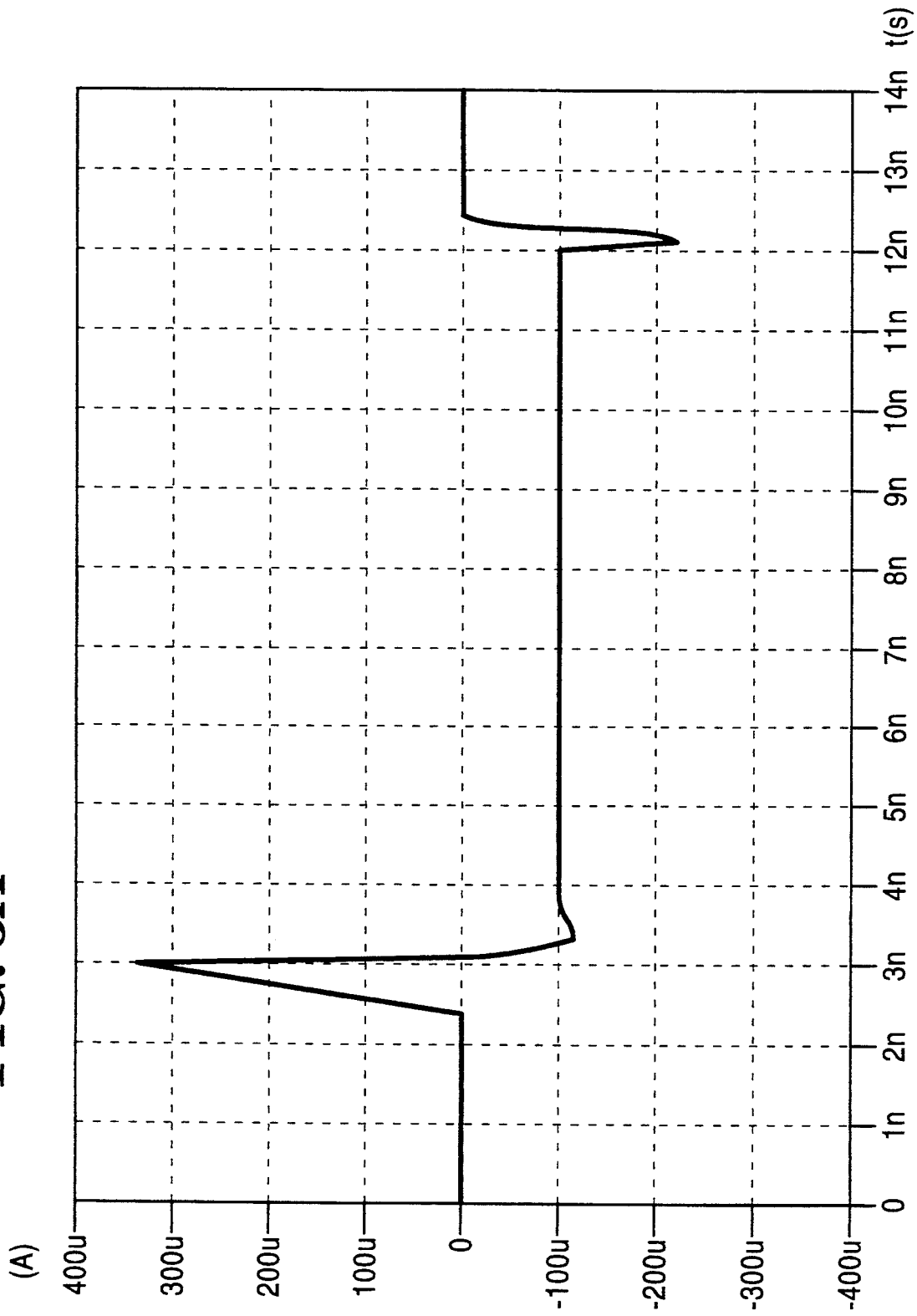

Referring now to FIGS. 3A and 3B, the advantages of the charge pump circuit 10 of the present invention are illustrated. The waveform of FIG. 3A represents the charge current of conventional charge pumps. The waveform associated with discharge current is similar in shape to the waveform of FIG. 3A, but reversed in polarity and different in phase.

FIG. 3B represents the charge current of circuit 10 of the present invention. The waveform associated with discharge current is similar in shape to the waveform of FIG. 3B, but reversed in polarity and different in phase. Note that the overshoot at the beginning of the charge cycle and the undershoot at the end of the charge cycle are all but eliminated. Typically, the charge represented by the area of the remaining undershoot or overshoot is limited to no more than about 20% of the total charge or discharge current. As a result, it is easier to match the charge and discharge currents, especially if the charge and discharge cycles are very short. Furthermore, less noise is injected into the VCO. Consequently, charge pump 10 may be used in applications where high frequency operation is required (about 600 MHz or above).

Although the present invention has been described with particular reference to certain preferred embodiments thereof, variations and modifications of the present invention can be effected within the spirit and scope of the following claims.

What is claimed is:

1. A charge pump circuit, which is coupled between a phase detector and a loop filter in a phaselocked loop circuit, and which comprises:

a level shifter circuit which reduces voltage swings in Up and Down signals from the phase detector; and a feedback circuit coupled to the level shifter which minimizes overshoot and undershoot noise in the charge and discharge output signals, including:

a first current source for providing charge current, first circuit means for decreasing current from the output of the charge pump during an overshoot condition, and increasing current to the output of the charge pump during an undershoot condition;

a second current source for providing discharge current; and second circuit means for diverting current to the output of the charge pump during an undershoot condition, and diverting current from the output of the charge pump during an overshoot condition.

2. The charge pump circuit as recited in claim 1, wherein the level shifter circuit comprises:

a first attenuation circuit coupled to the phase detector which reduces the voltage swings in the Up signal; and a second attenuation circuit coupled to the phase detector which reduces the voltage swings in the Down signal.

3. The charge pump circuit as recited in claim 2, further comprising:
   a bias circuit which provides a fixed bias voltage to the first and second attenuation circuits.

4. The charge pump circuit as recited in claim 3, wherein the bias circuit also provides first and second bias voltages to the feedback circuit.

5. The charge pump circuit as recited in claim 1, wherein the first circuit means comprises:
   a first source-coupled pair having first and second drains, wherein the first drain is coupled to the output o the charge pump;
   a first differential amplifier having first and second inputs, wherein the first input is coupled to the output of the charge pump and wherein the second input is coupled to the second drain; and
   a first tracking circuit coupled between the output of the differential amplifier and the second drain.

6. The charge pump circuit as recited in claim 5, wherein the second circuit means comprises:
   a second source-coupled pair having first and second drains, wherein the first drain is coupled to the output of the charge pump;
   a second differential amplifier having first and second inputs, wherein the first input is coupled to the output of the charge pump and wherein the second input is coupled to the second drain; and
   a second tracking circuit coupled between the output of the differential amplifier and the second drain.

7. A charge pump circuit, which is coupled between a phase detector and a loop filter in a phase-locked loop circuit, and which produces charge and discharge output signals comprising:
   a level shifter circuit which reduces voltage swings in up and down signals from the phase detector including a first attenuation circuit coupled to the phase detector which reduces the voltage swings in the Up signal, and a second attenuation circuit coupled to the phase detector which reduces the voltage swings in the Down signal, wherein the first attenuation circuit generates first and second complementary output signals, and wherein the second attenuation circuit generates third and fourth complementary output signals; and
   a feedback circuit coupled to the level shifter which minimizes overshoot and undershoot noise in the charge and discharge output signals including a first current source for providing charge current, first circuit means controlled by the first and second complementary output signals for decreasing current from the output of the charge pump during an overshoot condition and increasing current to the output of the charge pump during an undershoot condition, a second current source for providing discharge current, and second circuit means controlled by the third and fourth complementary output signals for increasing current to the output of the charge pump during an undershoot condition, and decreasing current from the output of the charge pump during an overshoot condition.

8. A method for generating charge and discharge current signals for charging and discharging a loop filter in response to Up and Down signals from a phase detector in a phase-locked loop circuit comprising the step of:
   (a) minimizing overshoots and undershoots in the charge and discharge current signals including the substeps of:
   (a-1) diverting charge current to or away from the loop filter; and
   (a-2) diverting discharge current to or away from the loop filter.

9. The method as recited in claim 8, wherein the step of minimizing further comprises the substeps of:
   (a-3) comparing the voltage at the input side of the loop filter to first and second predetermined reference voltages;
   (a-4) increasing the charge current when the voltage at the input side of the loop filter falls below the first predetermined reference voltage;
   (a-5) decreasing the charge current when the voltage at the input side falls above the first predetermined reference voltage;
   (a-6) increasing the discharge current when the voltage at the input side of the loop filter falls above the second predetermined reference voltage; and
   (a-7) decreasing the charge current when the voltage at the input side falls below the second predetermined reference voltage.

10. The method as recited in claim 9, further comprising the substeps of:
    (a-8) attenuating the Up and Down signals from the phase detector;
    (a-9) providing first and second complementary signals from the attenuated Up signal for controlling substeps a-4 and a-5;
    (a-10) providing third and fourth complementary signals from the attenuated Down signal for controlling substeps a-6 and a-7;
    (a-11) performing substep a-9 when an Up signal is provided by the phase detector; and
    (a-12) performing substep a-10 when a Down signal is provided by the phase detector.

* * * * *

UNITED STATES PATENT AND TRADEMARK OFFICE
CERTIFICATE OF CORRECTION

PATENT NO. : 5,363,066

DATED : November 8, 1994

INVENTOR(S) : Dao-Long Chen et al.

It is certified that error appears in the above-indentified patent and that said Letters Patent is hereby corrected as shown below:

Column 5, line 15, delete "o" and substitute --of--.

Signed and Sealed this

Twenty-ninth Day of August, 1995

Attest:

BRUCE LEHMAN

Attesting Officer     Commissioner of Patents and Trademarks